United States Patent [19]

Sopori

[11] Patent Number: 5,304,509
[45] Date of Patent: Apr. 19, 1994

[54] BACK-SIDE HYDROGENATION TECHNIQUE FOR DEFECT PASSIVATION IN SILICON SOLAR CELLS

[75] Inventor: Bhushan L. Sopori, Denver, Colo.

[73] Assignee: Midwest Research Institute, Kansas City, Mo.

[21] Appl. No.: 934,025

[22] Filed: Aug. 24, 1992

[51] Int. Cl.$^5$ .................. H01L 21/26; H01L 31/18
[52] U.S. Cl. ........................... 437/173; 437/2; 437/4; 437/939; 437/942; 437/980; 136/258; 136/261; 136/290; 148/DIG. 125; 148/DIG. 128; 148/DIG. 153
[58] Field of Search ............................ 437/2–5, 437/173–174, 929, 939, 942, 980; 136/258 PC, 261, 290; 148/DIG. 125, DIG. 128, DIG. 153

[56] References Cited

U.S. PATENT DOCUMENTS

| | | | |
|---|---|---|---|
| 4,612,698 | 9/1986 | Gonsiorawski et al. | 437/2 |
| 4,927,770 | 5/1990 | Swanson | 437/2 |
| 5,010,040 | 4/1991 | Vayman | 437/230 |
| 5,011,782 | 4/1991 | Lamb et al. | 437/2 |
| 5,030,295 | 7/1991 | Swanson et al. | 136/256 |
| 5,057,439 | 10/1991 | Swanson et al. | 437/2 |

OTHER PUBLICATIONS

S. Martinuzzi et al, *Conference Record, 19th IEEE Photovoltaic Specialists Conf.*, May 1987, pp. 1069–1074.
H. Yagi et al, *Conference Record, 20th IEEE Photovoltaic Specialists Conf.*, Sep. 1988, pp. 1600–1603.
B. L. Sopori et al, *Conference Record, 21st IEEE Photovoltaic Specialists Conf.*, May 1990, pp. 644–649.
M. A. G. Soler et al, *Ibid*, pp. 650–652.
M. Kaiser et al, *Ibid.*, pp. 691–694.

*Primary Examiner*—Aaron Weisstuch
*Attorney, Agent, or Firm*—Ken Richardson

[57] ABSTRACT

A two-step back-side hydrogenation process includes the steps of first bombarding the back side of the silicon substrate with hydrogen ions with intensities and for a time sufficient to implant enough hydrogen atoms into the silicon substrate to potentially passivate substantially all of the defects and impurities in the silicon substrate, and then illuminating the silicon substrate with electromagnetic radiation to activate the implanted hydrogen, so that it can passivate the defects and impurities in the substrate. The illumination step also annihilates the hydrogen-induced defects. The illumination step is carried out according to a two-stage illumination schedule, the first or low-power stage of which subjects the substrate to electromagnetic radiation that has sufficient intensity to activate the implanted hydrogen, yet not drive the hydrogen from the substrate. The second or high-power illumination stage subjects the substrate to higher intensity electromagnetic radiation, which is sufficient to annihilate the hydrogen-induced defects and sinter/alloy the metal contacts.

7 Claims, 2 Drawing Sheets

BACK-SIDE HYDROGENATION TECHNIQUE FOR DEFECT PASSIVATION IN SILICON SOLAR CELLS

CONTRACTUAL ORIGIN OF THE INVENTION

The United States Government has rights in this invention under Contract No. DE-AC02-83CH10093 between the U.S. Department of Energy and the National Renewable Energy Laboratory, a Division of Midwest Research Institute.

BACKGROUND OF THE INVENTION

1. Field of the Invention

The present invention relates to hydrogenation of silicon substrates in general and in particular to an improved hydrogenation method for passivating defects in silicon solar cells.

2. Background of the Invention

A typical silicon solar cell comprises a p-type and an n-type conductivity region in a silicon substrate and generates electricity when impinging radiation creates electron-hole pairs that migrate to the respective p-type and n-type conductivity regions. Unfortunately, certain impurities in the silicon substrate, as well as defects in the crystal lattice itself, can reduce the efficiency of the solar cell over what otherwise could be achieved if the silicon substrate were perfect and defect free. Consequently, researchers have searched for ways to minimize the effects of such defects and impurities, thus increasing the overall efficiency of the cell.

One method to minimize the effects of the defects and impurities is to hydrogenate the cell by implanting hydrogen into the silicon substrate. Although the exact effect that hydrogen has on the substrate is not yet fully understood, it is known that the hydrogen minimizes or "passivates" the defects and impurities in the substrate. For example, many of the unit cells in the crystal lattice may be missing one or more silicon atoms, creating voids or areas where silicon atoms should be, but are not. Hydrogenating the substrate allows hydrogen atoms to fill those voids in the unit cells, thereby reducing the deleterious effects of those voids or defects. In fact, it is now well established that the performance of solar cells, as well as many other electronic devices that are fabricated on p-doped and n-doped silicon substrates, such as integrated circuits, can be improved by such hydrogen passivation. With regard to solar cells, hydrogen passivation improves cell efficiency by reducing minority carrier recombination losses at grain boundaries, dislocations, and other defects in the crystal lattice. Unfortunately, while the improved performance resulting from hydrogen passivation has been demonstrated in the laboratory, it has been difficult to apply hydrogen passivation techniques commercially, because the precise effects of hydrogenation on the silicon substrate still are not well understood.

In the past, solar cells have been hydrogenated by introducing hydrogen into silicon substrate from the junction or front side of the cell by using an RF plasma or by ion implantation. However, front-side hydrogenation is not without its disadvantages. For example, all the cell processes that require temperatures in excess of 300° C. must be carried out prior to hydrogenation, since temperatures above about 300° C. will drive the previously implanted hydrogen out of the substrate. Moreover, because hydrogen ions do not readily pass through the anti-reflective (AR) coatings usually placed on the front-side of the cell, front side hydrogenation also must be performed prior to the deposition of the AR coating. Therefore, the subsequent AR coating process must be carried out at a temperature below 300° C., which, unfortunately, requires the use of more expensive coatings and processes. Also, such coatings and processes make it more difficult to achieve good AR coatings over large areas. Another significant disadvantage associated with the front-side hydrogenation process is that it creates a damaged surface layer on the front side of the substrate. The actual thickness of the damaged surface layer is relatively small compared to the total thickness of the substrate, but the damaged surface layer nevertheless reduces cell performance.

Recognizing the disadvantages associated with front surface hydrogenation, researchers have developed various processes to hydrogenate the substrate from the back-side. A primary advantage of back side hydrogenation is that the damaged surface layer is created on, and confined to, the back side of the substrate, away from the junction side of the cell, thus minimizing its adverse effect on cell performance. Another advantage associated with back-side hydrogenation is that it can be performed after the deposition of the front-side AR coating, since the hydrogen ions are implanted from the back-side of the cell. Unfortunately, however, back side hydrogenation is not without its drawbacks. For example, back-side hydrogenation requires either a fully open or a partially open back contact, so the hydrogen can be implanted into the substrate. Another disadvantage is that it is still necessary to ensure that the subsequent processing steps, such as annealing or alloying, are carried out at temperatures below 300° C. to prevent the hydrogen from escaping from the substrate.

One way around the temperature limitation described above is to coat the back side of the cell with a hydrogen-encapsulating material to prevent the escape of the implanted hydrogen during subsequent high-temperature processing. In my paper entitled A Backside Hydrogenation Technique for Defect Passivation in Silicon Solar Cells, J. Appl. Phys. Vol. 64, 15 November 1988, pp. 5264–5266, I described a process to confine the hydrogen in the silicon substrate during the subsequent back-side contact alloying process. Essentially, that process required the deposition of a layer of aluminum about 2000 Å thick on the back side of the cell to prevent the hydrogen from escaping during subsequent high-temperature processing. Although the foregoing process attempted to maximize the then-recognized benefits of substrate hydrogenation, the aluminum coating process represented an additional step that did not directly add to cell efficiency. Also, at that time it was not generally recognized that the hydrogenation process, while effectively reducing the minority carrier recombination losses, introduced its own performance degrading effects on the solar cell, which effects should be minimized to maximize cell efficiency.

Therefore, there is a need for an improved hydrogen passivation process that maximizes the passivation effect on defects and impurities in the silicon substrate, while at the same time minimizing the deleterious effects associated with hydrogenation itself. Ideally, such a process should be able to be performed on completed solar cells and with a minimum number of steps to minimize cell production costs. Until this invention, no such process existed.

SUMMARY OF THE INVENTION

Accordingly, it is a general object of this invention to provide an improved hydrogenation process that maximizes the passivation of defects and impurities in the silicon substrate and minimizes the deleterious effects introduced by the hydrogenation process itself.

It is another object of this invention to provide an improved hydrogenation process that does not require the deposition of a hydrogen-encapsulating coating.

It is a further object of this invention to provide an improved hydrogenation process that can be performed on a completed solar cell.

It is yet a further object of this invention to provide an improved back-side hydrogenation process that can produce epitaxial regrowth of the damaged surface layer.

It is still yet another object of this invention to reverse deactivation of boron within the bulk of the substrate.

Additional objects, advantages, and novel features of this invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purposes of the present invention, as embodied and broadly described herein, the improved back-side hydrogenation process according to this invention may comprise the steps of first bombarding the back side of the silicon substrate with hydrogen ions with intensities and for a time sufficient to implant enough hydrogen atoms into the silicon substrate to potentially passivate substantially all of the defects and impurities in the silicon substrate, and then illuminating the silicon substrate with electromagnetic radiation to activate the implanted hydrogen, so that it can passivate the defects and impurities in the substrate. The illumination step also annihilates the hydrogen-induced defects. Significantly, the illumination step is carried out according to a two-stage illumination schedule. The first or low-power illumination stage subjects the substrate to electromagnetic radiation that has sufficient intensity to activate the implanted hydrogen, yet not drive the hydrogen from the substrate. The second or high-power illumination stage subjects the substrate to higher intensity electromagnetic radiation, which is sufficient to annihilate the hydrogen-induced defects and sinter/alloy the metal contacts.

BRIEF DESCRIPTION OF THE DRAWINGS

The accompanying drawings, which are incorporated herein and form a part of the specification, illustrate the preferred embodiment of the present invention and together with the description, serve to explain the principles of the invention. In the drawings.

DETAILED DESCRIPTION OF THE PREFERRED EMBODIMENT

Figure 1:
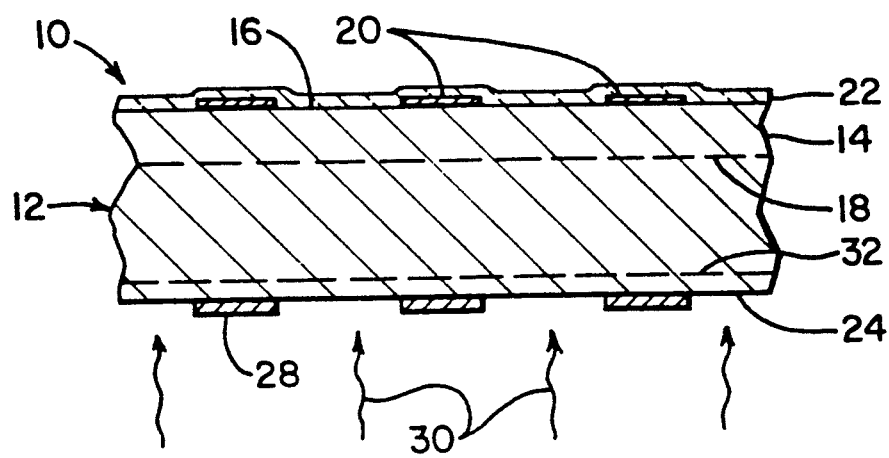
FIG. 1 is a side view in elevation of a typical solar cell being hydrogenated by the process according to the present invention.
Figure 2:
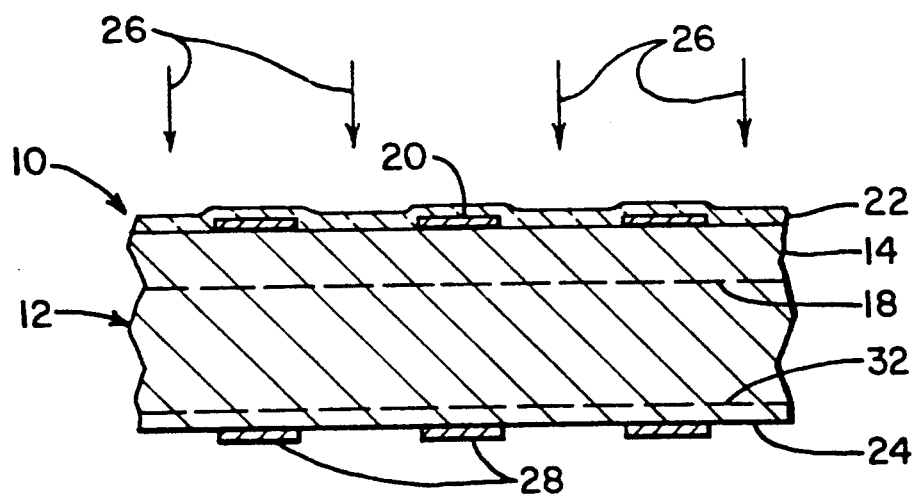
FIG. 2 is a side view in elevation of the hydrogenated solar cell being illuminated according to the illumination schedule of the present invention.
Figure 3:
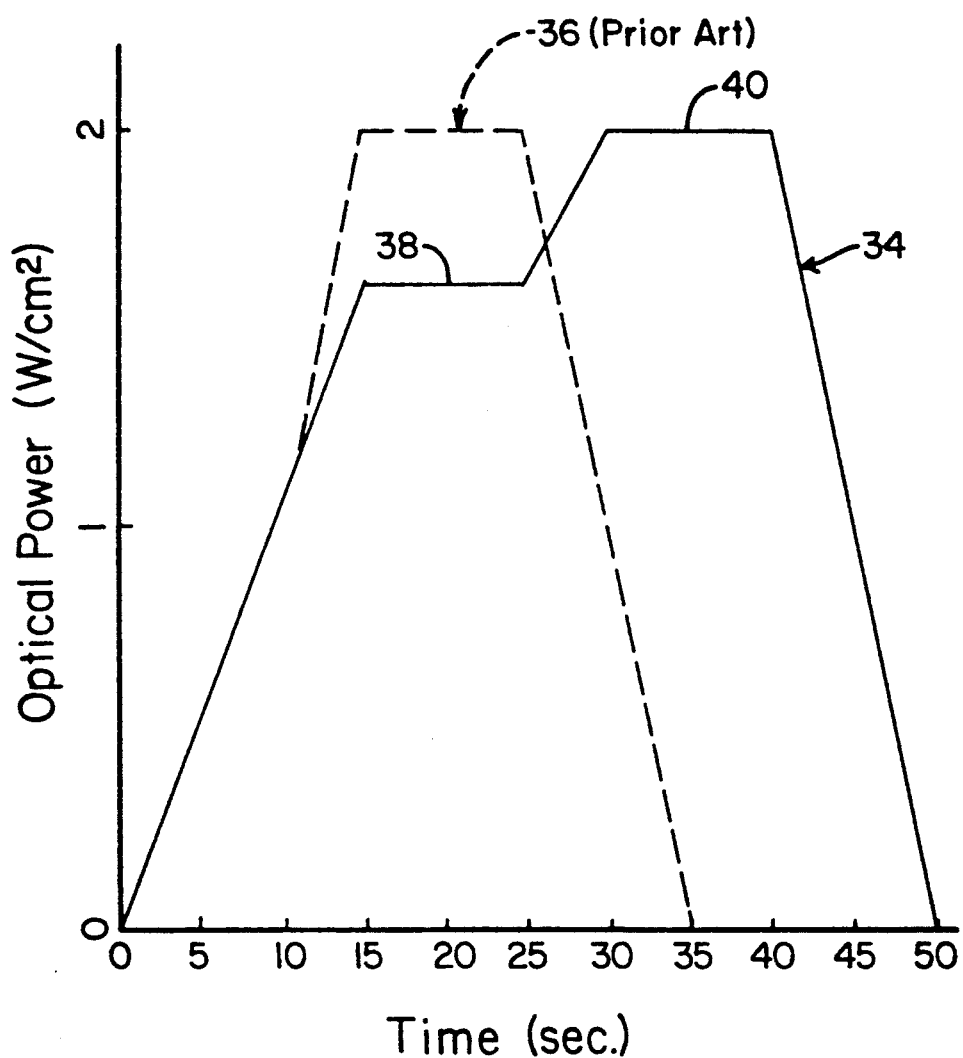
FIG. 3 is a graph showing the two-stage illumination schedule according to the present invention as a function of optical power per unit area versus time.

The improved back-side hydrogenation process according to the present invention is best seen in FIGS. 1 and 2 as it is used to hydrogenate a prefabricated polycrystalline photovoltaic solar cell 10 of the type well known in the art. The hydrogenation process according to the present invention is a two-step process. The first step in the process implants hydrogen atoms into the substrate 12 of cell 10 by exposing the back side 24 to a hydrogen ion beam 30 generated by a conventional Kaufman ion source (not shown). The implanted hydrogen atoms then rapidly diffuse throughout the substrate 12 by a mechanism that will be explained in more detail below. After the hydrogen has been implanted, the front side 16 of cell 10 is then illuminated by a light beam 26 in accordance with a two-stage illumination schedule 34 (FIG. 3). Essentially, the two-stage illumination schedule 34 exposes the hydrogenated cell to light radiation that has specific wavelength bands and specific intensity variations over time. Briefly, the first or low-power stage 38 of the illumination schedule 34 activates the implanted hydrogen atoms so that they are free to move about the lattice and passivate the defects and impurities in the substrate. The second or high-power stage 40 of the illumination schedule 34 annihilates the hydrogen-induced defects and allows for the simultaneous sintering/alloying of the metallic coatings, if applicable, all while preventing the implanted hydrogen from being driven from the substrate.

A significant advantage associated with the improved hydrogenation process according to the present invention is that it can be performed on completed cells and does not require the deposition of a separate, hydrogen-encapsulating coating. The hydrogenation process thereby maximizes cell performance and efficiency while minimizing the extra expense and processing steps typically associated with prior art hydrogenation methods. More importantly, because the hydrogenation process can be performed on finished cells, it does not restrict the materials or the kinds of processing steps that can be used to manufacture the cells. Another significant advantage of the hydrogenation process is that, not only does it provide for increased cell efficiency due to the passivation effect of the hydrogen, but that increases in cell efficiency are not compromised by the additional defects typically introduced by hydrogenation, such as the creation of defects deep within the substrate or the creation of a damaged surface layer. The second or high-power stage 40 of the illumination schedule 34 not only annihilates the hydrogen-induced defects, but also produces an epitaxial regrowth of the damaged back surface layer, thus further increasing cell efficiency. As an added advantage, the illumination process also reverses boron deactivation within the substrate.

Referring now to FIG. 1, the improved back-side hydrogenation process according to the present invention will now be described in detail as it is applied to a conventional solar cell 10 having a p-type polycrystalline silicon substrate 12. In accordance with standard practice, an n-type conductivity region 14 is created on the front side 16 of substrate 12 and is separated from the p-type substrate 12 by a junction 18. A plurality of front surface metallic contacts 20 are disposed on the front surface 16 and both the front surface 16 and metallic contacts 20 are covered by an AR coating 22. Similarly, a plurality of back surface contacts 28 are disposed on the back side 24 of substrate 12. Back surface contacts 28 may be already sintered or alloyed to the back surface 24 of substrate 12, although it is not necessary. The back surface metallic contacts 28 may be sintered or alloyed during the illumination process, as will be described in more detail below.

The first step in the improved hydrogenation process is to implant hydrogen atoms into the substrate 12, so that they can eventually passivate the defects and impurities in the silicon crystal lattice and reduce minority carrier losses at grain boundaries, dislocations, and other defects in the substrate. The hydrogen atoms are implanted into the substrate 12 by exposing the back side 24 to a relatively low-energy hydrogen ion beam 30 produced by a conventional Kaufman ion source (not shown). For effective implantation, the hydrogen ions 30 should have energies in the range of 500 eV to 2 keV and the substrate should be maintained at a temperature below about 300° C. and preferably in the range of about 100° C. to 300° C. In the preferred embodiment, the hydrogen is implanted at 1.5 keV with a beam current of about 0.5 mA/cm$^2$ for 15 minutes and the substrate is maintained at a temperature of about 250° C. Of course, lower beam current densities can be used if the exposure time is correspondingly increased. For example, if the beam current density is reduced to about 0.2 mA/cm$^2$, the exposure time should be increased to about 30 minutes.

As is well known, the hydrogen ion beam 30 will create a damaged surface layer 32. While the exact nature of the damaged surface layer 32 created by the implantation of hydrogen ions is not known, it is believed to be a damaged area wherein the crystal structure has been somewhat disrupted by the incident hydrogen ions. At any rate, it is known that a damaged surface layer impairs the performance of the solar cell, particularly when it is located on the junction or front side 16 of the cell 10. Back-side hydrogenation, therefore, allows the damaged surface to be kept away from the junction side to reduce the performance-degrading effect that it has on the cell.

Until recently, it was thought that the damaged surface layer 32 was the only area damaged by the implanted hydrogen. However, it has since been discovered that the defects introduced by the hydrogenation process are not limited to the damaged surface layer 32, but extend deep within the substrate itself. Even less is known about the exact nature of the deep hydrogen defects than about the nature of the damaged surface layer 32 but, it is known that those defects partially offset the gains achieved by hydrogen passivation. Accordingly, the optical processing step of the present invention includes a two-stage illumination schedule that annihilates a substantial percentage of the deep hydrogen-induced defects.

The optical processing step and its associated illumination schedule 34 are best seen by referring simultaneously to FIGS. 2 and 3. As mentioned above, the illumination schedule 34 is significant in that it is responsible for many of the improvements associated with the process of the present invention. However, it will be easier to understand and apply the illumination schedule 34 shown in FIG. 3 after first briefly describing the mechanism thought to control the hydrogen diffusion and passivation process.

Since solar cells are minority carrier devices, the implanted hydrogen should be diffused throughout the entire substrate 12, typically about 300 μm thick, for effective passivation. Although little is known about the diffusivity of hydrogen in silicon and its dependence on material parameters, or the impurity/defect passivation mechanism itself, I have developed a model for the hydrogen diffusion process that is in good agreement with experimental results derived thus far. According to that model, the implanted hydrogen ions combine with vacancies in the substrate to form hydrogen-vacancy (H-V) complexes that are nearly as mobile as the individual vacancies themselves. These H-V complexes rapidly carry the hydrogen atoms throughout the entire substrate, resulting in much higher diffusivities than observed in Czochralski and Float Zone wafers, heretofore thought to permit the highest hydrogen diffusivities. While the high hydrogen diffusivity resulting from the H-V complexes is advantageous in distributing the available hydrogen atoms throughout the lattice, the hydrogen atoms must be separated from the H-V complexes before they can migrate to and passivate the large-scale defects in the lattice. The optical processing step of the present invention optically and electrically activates the inactive hydrogen atoms and separates them from the H-V complexes.

Referring now to FIG. 2, the optical processing step is carried out by illuminating the front surface 16 of the solar cell with high intensity radiation 26 according to the two-stage illumination schedule 34 shown in FIG. 3. The first or low-power stage 38 breaks apart the H-V complexes, while the second or high-power stage 40 annihilates the hydrogen-induced defects and sinters/alloys the metal contacts to the cell. The high-power stage 40 also promotes epitaxial regrowth of the previously damaged surface layer 32. While the two-stage illumination schedule 34 exposes the cell to approximately the same maximum power per unit area as the conventional illumination schedule 36 typically associated with conventional backside hydrogenation techniques, the existence of the lower power stage 38 allows the optical processing step to achieve results that were not possible with the prior art illumination schedules. Advantageously, the first or low-power stage 38 breaks up or dissociates the H-V complexes, freeing the hydrogen to passivate large-scale defects and impurities, without driving the hydrogen from the substrate. Then, the optical power is increased to the second or high-power stage 40 to anneal the hydrogen-induced defects by optical and thermal dissociation. The second power stage 40 also transfers sufficient energy to the cell to sinter/alloy the metal contacts 28 to the back surface 24 of substrate 12, if such sintering/alloying was not already performed on the finished solar cell 10.

The electromagnetic radiation used in the illumination step according to this invention should have wavelengths in the range of about 4000 Å to 15,000 Å. The intensity of the low-power stage 38 should be in the range of about 1.5 to 3 watts/cm$^2$ and the intensity of the high-power stage 40 in the range of about 2 to 4 watts/cm$^2$. The durations of both the low-power and high-power stages should be in the range of 10 to 20 seconds, yielding a total exposure time in the range of about 30 to 60 seconds. In the preferred embodiment, the optical power (illumination intensity), is linearly increased or "ramped up" over a period of about 15 seconds to the first or low-power level 38, which is maintained at an intensity of about 1.5 watts/cm² for about 10 seconds. The illumination intensity is then increased over the period of about 5 seconds to the second or high-power level 40, which is maintained at an intensity of about 2 watts/cm² also for about 10 seconds. The illumination intensity is then linearly decreased to zero over a period of about 5 seconds, yielding a total exposure time of about 45 seconds.

It should be noted that the "ramp up" or steady increase in the optical power described in the foregoing example is not a requirement of the illumination schedule 34, but rather is imposed by the particular optical apparatus used to expose the cell. The only requirement of the illumination schedule 34 according to this invention is that it include a low-power stage 38 to dissociate the H-V complexes without driving the hydrogen from the substrate, and a second, higher power stage 40 to anneal the hydrogen-imposed defects. Also, while the particular illumination schedule 34 shown and described herein is effective for passivating low-cost polycrystalline solar cells, other illumination schedules are possible depending on the characteristics of the particular substrate sought to be passivated, as well as on the degree of passivation desired. Since such alternate illumination schedules would be obvious to persons having ordinary skill in the art after having become familiar with the details of the present invention as well as with the purposes to be accomplished by the illumination step, the present invention should not be regarded as limited to the particular illumination schedule 34 shown and described herein.

The foregoing is considered illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to as falling within the scope of the invention as defined by the claims that follow.

The embodiments of the invention in which an exclusive property or privilege is claimed are defined as follows:

1. A method of hydrogenating a silicon substrate, wherein said silicon substrate has a front side and a back side and includes a plurality of defects and impurities, comprising the steps of:
   bombarding the back side of the silicon substrate with hydrogen ions with sufficient intensity and for a sufficient time to implant an amount of hydrogen atoms into the silicon substrate sufficient to potentially passivate substantially all of the defects and impurities in the silicon substrate; and
   illuminating the silicon substrate in a low-power stage with electromagnetic radiation having a low-power intensity for a sufficient time to activate the hydrogen atoms in the substrate and passivate substantially all of the defects and impurities in the substrate, but not drive the hydrogen atoms out of the substrate, and then illuminating the silicon substrate in a high-power stage having a higher power intensity sufficient to annihilate substantially all hydrogen-induced defects.

2. The method of hydrogenating the silicon substrate of claim 1, wherein said low-power intensity is in the range of about 1.5 to 3 watts/cm² and said higher power intensity is in the range of about 2 to 4 watts/cm².

3. The method of hydrogenating the silicon substrate of claim 2, wherein the electromagnetic radiation remains in said lower power stage for a time in the range of about 10 to 20 seconds and wherein the electromagnetic radiation remains in said higher power stage for a time in the range of about 10 to 20 seconds.

4. The method of hydrogenating the silicon substrate of claim 3, wherein the electromagnetic radiation has wavelengths in the range of 4,000 Å to 15,000 Å.

5. The method of hydrogenating the silicon substrate of claim 4, wherein the substrate is illuminated for a total time in the range of about 30 to 60 seconds.

6. The method of hydrogenating the silicon substrate of claim 5, wherein the implanted hydrogen ions have energies in the range of about 500 eV to about 2 keV.

7. The method of hydrogenating the silicon substrate of claim 6, wherein the hydrogenation implant step is performed when the substrate is at a temperature in the range of about 100° C. to 300° C.

* * * * *